United States Patent
Wristers et al.

(10) Patent No.: US 7,253,045 B1
(45) Date of Patent: Aug. 7, 2007

(54) SELECTIVE P-CHANNEL $V_T$ ADJUSTMENT IN SIGE SYSTEM FOR LEAKAGE OPTIMIZATION

(75) Inventors: Derick J. Wristers, Bee Caves, TX (US); David Wu, Austin, TX (US); Hormuzdiar E. Nariman, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 230 days.

(21) Appl. No.: 10/889,026

(22) Filed: Jul. 13, 2004

(51) Int. Cl.
 *H01L 27/092* (2006.01)
 *H01L 29/786* (2006.01)
(52) U.S. Cl. .............. 438/199; 257/616; 257/E27.064; 257/E29.297
(58) Field of Classification Search .............. 257/616, 257/E27.064, E29.297; 438/518, 520
See application file for complete search history.

(56) References Cited

U.S. PATENT DOCUMENTS

| | | | | |
|---|---|---|---|---|
| 6,734,527 B1 * | 5/2004 | Xiang | ......................... | 257/616 |
| 6,764,908 B1 * | 7/2004 | Kadosh et al. | .............. | 438/285 |
| 6,906,393 B2 * | 6/2005 | Sayama et al. | ............. | 357/414 |
| 6,914,301 B2 * | 7/2005 | Bae et al. | .................... | 257/347 |
| 6,916,727 B2 * | 7/2005 | Leitz et al. | ................. | 438/478 |
| 6,949,436 B2 * | 9/2005 | Buller et al. | ................ | 438/303 |
| 6,974,735 B2 * | 12/2005 | Fitzgerald | ................... | 438/197 |
| 2005/0023520 A1 * | 2/2005 | Lee et al. | ..................... | 257/19 |

* cited by examiner

*Primary Examiner*—Carl Whitehead, Jr.
*Assistant Examiner*—Jennifer M Dolan
(74) *Attorney, Agent, or Firm*—McDermott Will & Emery

(57) ABSTRACT

A method of manufacturing a semiconductor device includes forming a silicon germanium layer and a N-channel transistor and a P-channel transistor over the silicon germanium layer. A beta ratio of the N-channel transistor to the P-channel transistor is about 1.8 to about 2.2. A semiconductor device is also disclosed.

7 Claims, 2 Drawing Sheets

US 7,253,045 B1

SELECTIVE P-CHANNEL V$_T$ ADJUSTMENT IN SIGE SYSTEM FOR LEAKAGE OPTIMIZATION

FIELD OF THE INVENTION

The present invention relates to the manufacturing of semiconductor devices, and more particularly, to semiconductor devices based upon a silicon germanium (SiGe) substrate with an optimized drive current ratio.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS device includes a bulk semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS device is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

As an alternative to forming a MOS device directly on a bulk semiconductor substrate, the MOS device can be formed on a strained-silicon layer. The process for forming strained-silicon involves depositing a layer of silicon germanium (SiGe) on the bulk semiconductor substrate. A thin layer of silicon is subsequently deposited on the SiGe layer. The distance between atoms in a SiGe crystal lattice is greater than the distance between atoms in an ordinary silicon crystal lattice. However, there is a natural tendency of atoms inside different types of crystals to align with one another where one crystal is formed on another crystal. As such, when a crystal lattice of silicon is formed on top of a layer of SiGe, the atoms in the silicon crystal lattice tend to stretch or "strain" to align with the atoms in the SiGe lattice. A resulting advantage of such a feature is that the strained silicon experiences less resistance to electron flow and produces gains of up to 80% in speed as compared to ordinary crystalline silicon.

MOS devices using a strained-silicon structure typically fall in one of two groups depending on the type of dopants used to form the source, drain and channel regions. The two groups are often referred to as n-channel and p-channel devices. The type of channel is identified based on the conductivity type of the channel which is developed under the transverse electric field. In an N-channel MOS (NMOS) device, for example, the conductivity of the channel under a transverse electric field is of the conductivity type associated with n-type impurities (e.g., arsenic or phosphorous). Conversely, the channel of a P-channel MOS (PMOS) device under the transverse electric field is associated with p-type impurities (e.g., boron).

One consideration when manufacturing NMOS and PMOS strained-silicon transistors is the beta ratio (i.e., N/P ratio, drive current ratio) of the transistors. A beta ratio of approximately 3.0 is commonly used to maintain cell stability. However, it has been found that in MOS devices based on SiGe, the drive current of the N-channel transistor increases with respect to the drive current of the P-channel transistor, such that the N-channel transistor runs hotter than the P-channel transistor. A desired drive current ratio between N-channel and P-channel transistors can therefore not be maintained. Accordingly, a need exists for an improved method of forming devices on a strained-silicon structure that allows for optimum performance by controlling the beta ratio or drive current ratio of the N-channel transistor with respect to the P-channel transistor.

SUMMARY OF THE INVENTION

This and other needs are met by embodiments of the present invention which provide a method of manufacturing a semiconductor device that improves performance by controlling the beta ratio of a N-channel transistor with respect to a P-channel transistor. The method includes forming a silicon germanium layer, and forming the N-channel transistor and the P-channel transistor over the silicon germanium layer. A beta ratio of the N-channel transistor to the P-channel transistor is then controlled to be from about 1.8 to about 2.2.

The beta ratio can be controlled by selectively implanting source/drain regions of the P-channel transistor with a P-type dopant, with the implant energies and dosages for the P-type dopant ranging respectively from about 1 keV to about 10 keV and from about $1 \times 10^{14}$ to about $5 \times 10^{15}$ dopants/cm$^2$. The N-channel transistor includes source/drain regions implanted with a N-type dopant, and the implant energies and dosages for the N-type dopant range respectively from about 0.5 keV to about 60 keV and from about $1 \times 10^{14}$ to about $5 \times 10^{15}$ dopants. In another aspect of the invention, the depth of the source/drain regions of the N-channel transistor is from about 0.1 to about 1.0 µm, and the and the depth of the source/drain regions of the P-channel transistor is from about 0.1 to about 1.0 µm. In still another aspect of the invention, a beta ratio of another N-channel transistor to another P-channel transistor is greater than 2.2 where the beta ratio is not as critical.

In another embodiment of the present invention, a semiconductor device is provided. The semiconductor device includes a N-channel transistor and a P-channel transistor formed over the silicon germanium layer. A beta ratio of the N-channel transistor to the P-channel transistor is controlled to be from about 1.8 to about 2.2.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention improves performance by controlling the beta ratio or drive current ratio of P-channel and N-channel transistors formed on a silicon germanium (SiGe) structure. This is achieved, in part, by adjusting the doping density of source/drain regions in the P-channel transistor so that the beta ratio of the N-channel and P-channel transistors is from about 1.8 to about 2.2. By controlling the beta ratio of the N-channel transistor with respect to the P-channel transistor, optimum performance can be maintained.

Figure 1:
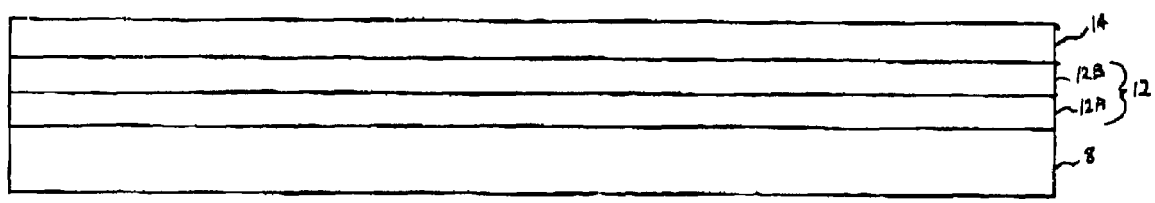
FIGS. 1-3 schematically illustrate sequential phases of a fabrication method according to an embodiment of the present invention.
Figure 2:
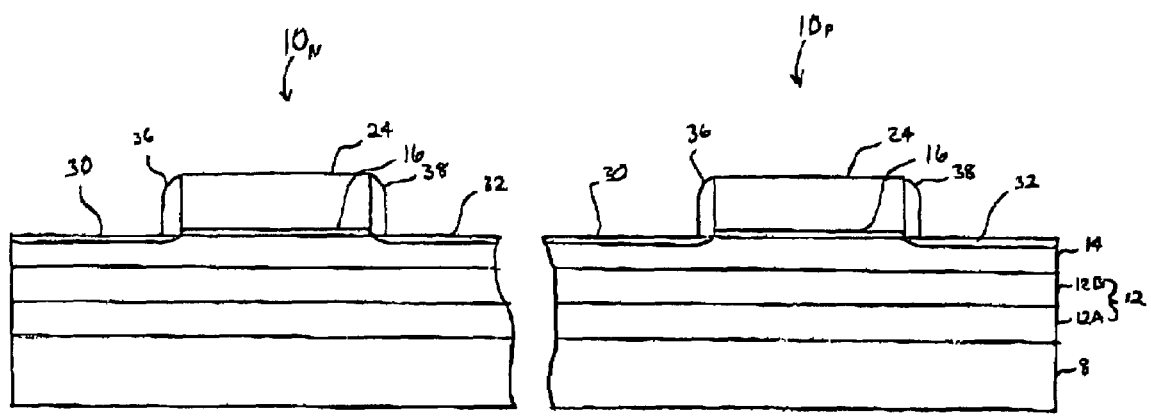
Figure 3:
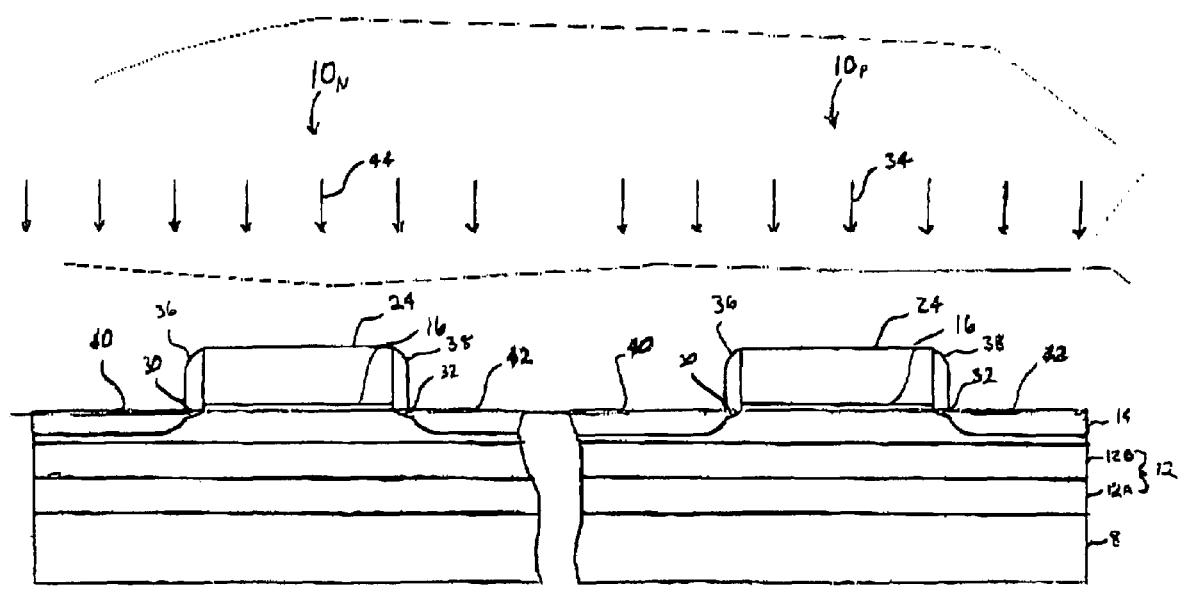

The present invention can be implemented with a wide variety of SiGe-type substrates, such as a $Si_xGe_{1-x}$ substrate wherein x can range from 0 atomic percent to 100 atomic percent. Additional substrates can include SiGe substrates over which a layer of strained silicon is placed. An example of the present invention is illustrated in FIGS. 1-3. FIG. 1 illustrates a conventional strained-silicon structure. The strained-silicon structure includes a silicon germanium layer 12 formed over a substrate 8, and a strained-silicon semiconductor layer 14 formed on the silicon germanium layer 12. The invention, however, is not limited as to the manner in which the strained-silicon structure is formed.

An exemplary method of forming a strained-silicon structure is as follows. The substrate 8 can be a silicon wafer having a thickness of approximately 100 μm. The silicon germanium layer 12 is formed over the substrate 8 using a chemical vapor deposition (CVD) process, such as ultra-high vacuum chemical vapor deposition (UHVCVD). The silicon germanium layer 12 can comprise a sublayer 12A, in which the concentration of Ge in the sublayer 12A is graded from about 0% Ge at the silicon germanium layer 12/substrate 8 interface to a maximum concentration of about 30% Ge. In certain aspects, the maximum concentration of Ge is about 20% Ge. Also, the thickness of the graded-concentration sublayer 12A can be about 2 μm.

After the maximum desired concentration of Ge is achieved in the first sublayer 12A, a second silicon germanium sublayer 12B having a substantially constant Ge concentration can be formed on the first sublayer 12A. The second germanium sublayer 12B, although not limited in this manner, has a thickness between about 1 μm and about 2 μm. The resulting silicon germanium layer 12, therefore, can have an overall thickness of between about 3 μm and about 4 μm. The concentration of Ge in the constant-concentration sublayer 12B is substantially equal to the maximum Ge concentration in the graded-concentration sublayer 12A.

The strained silicon layer 14 is an epitaxial layer formed, for example, by CVD. The atoms in the silicon layer 14 stretch apart from each other in order to align themselves with the underlying lattice structure of the silicon germanium layer 12. Electron flow in this resulting strained silicon layer 14 is advantageously much faster than in ordinary crystalline silicon. Although not limited in this manner, the thickness of the strained silicon layer is between about 20 nm to about 40 nm.

As illustrated in FIGS. 2 and 3, an N-channel transistor $10_N$ and a P-channel transistor $10_P$ are formed on the strained-silicon structure. The invention is not limited as to the type of N-channel and P-channel transistors $10_N$, $10_P$ being formed or the manner of forming these transistors, as many types of transistors and many methods of forming these transistors are well known to those having skill in the art. As illustrated in FIG. 2, the N-channel and P-channel transistors $10_N$, $10_P$ can include, for example, a gate dielectric 16 and a gate electrode 24 over the gate dielectric 16. Sidewall spacers 36, 38 can be formed on sidewalls 26, 28 of the gate electrode 24, and source/drain extensions 30, 32 can be formed in the silicon layer 14 underneath the sidewall spacers 36, 38.

In a current aspect of the invention, the beta ratio of the N-channel and P-channel transistors $10_N$, $10_P$ is modified. As is known to those skilled in the art, the beta β of a transistor designates the current gain of the transistor and is the ratio of the transistor's output current (drive current) to its input current ($\beta = I_{ouput}/I_{input}$). The beta ratio ($\beta_N/\beta_P$) is defined as the ratio of the beta $\beta_N$ of the N-channel transistor $10_N$ to the beta $\beta_P$ of the P-channel transistor $10_P$. In conventional devices, a beta ratio ($\beta_N/\beta_P$) of approximately 3.0 is commonly used to maintain cell stability. However, it has been discovered that the N-channel transistors $10_N$ run hotter than the P-channel transistors $10_P$ in strained-silicon structures, such that the drive current of the N-channel transistors $10_N$ increases with respect to the drive current of the P-channel transistors $10_P$. Therefore, for those particular circuits where the beta ratio ($\beta_N/\beta_P$) is critical to optimize gate leakage versus performance, it has been determined that a revised beta ratio ($\beta_N/\beta_P$) of about 1.8 to about 2.2 is desired. However, for those circuits where the beta ratio ($\beta_N/\beta_P$) is not as critical, a beta ratio ($\beta_N/\beta_P$) of greater than 2.2 can be used.

In modifying the beta ratio ($\beta_N/\beta_P$) of the N-channel and P-channel transistors $10_N$, $10_P$ to about 1.8 to about 2.2, the threshold voltage $V_T$ of the P-channel transistors $10_P$ is adjusted by changing the doping density of source/drain regions 40, 42 of the P-channel transistors $10_P$. As illustrated in FIG. 3, the source/drain regions 40, 42 of the P-channel transistors $10_P$ are formed by implantation, as represented by arrows 34, using a p-type dopant, such as boron. The implant energies and dosages for the p-type dopant range respectively from about 1 keV to about 10 keV and from about $1 \times 10^{14}$ to about $5 \times 10^{15}$ dopants/cm². The source/drain regions 40, 42 of the N-channel transistor $10_N$ are formed by doping, as represented by arrows 44, using an n-type dopant, such as arsenic or phosphorus. The implant energies and dosages for the n-type dopant respectively range from about 0.5 keV to about 60 keV and from about $1 \times 10^{14}$ to about $5 \times 10^{15}$ dopants/cm². Thus, the depth of the source/drain regions 40, 42 of the N-channel transistor $10_N$ is from about 0.1 to about 1.0 μm, and the depth of the source/drain regions 40, 42 of the P-channel transistor $10_P$ is from about 0.1 to about 1.0 μm.

By controlling the beta ratio or drive current ratio of P-channel and N-channel transistors formed on a silicon germanium layer from about 1.8 to about 2.2, the effects of forming a N-channel transistor over a silicon germanium layer can be accounted for. Thus, optimum performance of the transistor can be maintained.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of forming a semiconductor device, comprising the steps of:
   forming a silicon germanium layer;
   forming a N-channel transistor over the silicon germanium layer; and
   forming a P-channel transistor over the silicon germanium layer, wherein
   a beta ratio of the N-channel transistor to the P-channel transistor is about 1.8 to about 2.2 and
   the P-channel transistor includes source/drain regions implanted with a P-type dopant, and the implant energies and dosages for the P-type dopant range respectively from about 1 keV to about 10 keV and from about $1 \times 10^{14}$ to about $5 \times 10^{15}$ dopants/cm$^2$.

2. The method according to claim 1, wherein the N-channel transistor includes source/drain regions implanted with a N-type dopant, and the implant energies and dosages for the N-type dopant range respectively from about 0.5 keV to about 60 keV and from about $1 \times 10^{14}$ to about $5 \times 10^{15}$ dopants/cm$^2$.

3. The method according to claim 2, wherein the depth of the source/drain regions of the N-channel transistor is from about 0.1 to about 1.0 µm, and the and the depth of the source/drain regions of the P-channel transistor is from about 0.1 to about 1.0 µm.

4. A semiconductor device, comprising:
   a silicon-germanium layer;
   a N-channel transistor over the silicon germanium layer; and
   a P-channel transistor over the silicon germanium layer, wherein
   a beta ratio of the N-channel transistor to the P-channel transistor is about 1.8 to about 2.2,
   wherein the P-channel transistor includes source/drain regions implanted with a P-type dopant, and the implant energies and dosages for the P-type dopant range respectively from about 1 keV to about 10 keV and from about $1 \times 10^{14}$ to about $5 \times 10^{15}$ dopants/cm$^2$.

5. The semiconductor device according to claim 4, wherein the depth of source/drain regions of the N-channel transistor is from about 0.1 to about 1.0 µm, and the and the depth of source/drain regions of the P-channel transistor is from about 0.1 to about 1.0 µm.

6. A method of forming a semiconductor device, comprising the steps of:
   forming a silicon germanium layer;
   forming N-channel devices over the silicon germanium layer;
   forming P-channel devices over the silicon germanium layer; and
   adjusting $V_T$ of the P-channel devices,
   wherein a beta ratio of the N-channel devices to the adjusted P-channel devices is about 1.8 to about 2.2 and
   the $V_T$ of the P-channel devices is adjusted by implanting source/drain regions of the P-channel devices with a P-type dopant, and the implant energies and dosages for the P-type dopant range respectively from about 1 keV to about 10 keV and from about $1 \times 10^{14}$ to about $5 \times 10^{15}$ dopants/cm$^2$.

7. The method according to claim 6, wherein the N-channel devices include source/drain regions implanted with a N-type dopant, and the implant energies and dosages for the N-type dopant range respectively from about 0.5 keV to about 60 keV and from about $1 \times 10^{14}$ to about $5 \times 10^{15}$ dopants/cm$^2$.

* * * * *